United States Patent [19]
Mori

[11] Patent Number: 5,971,586
[45] Date of Patent: Oct. 26, 1999

[54] IDENTIFYING CAUSES OF SEMICONDUCTOR PRODUCTION YIELD LOSS

[75] Inventor: Kiyoshi Mori, San Antonio, Tex.

[73] Assignees: Sony Corporation, Tokyo, Japan; Sony Electronics Inc., Park Ridge, N.J.

[21] Appl. No.: 08/611,277

[22] Filed: Mar. 18, 1996

Related U.S. Application Data

[63] Continuation-in-part of application No. 08/426,711, Apr. 21, 1995, Pat. No. 5,665,609.

[51] Int. Cl.$^6$ ..................................................... G06F 19/00
[52] U.S. Cl. ............................... 364/468.15; 364/468.16; 364/468.17; 364/468.28; 324/765; 438/14
[58] Field of Search ..................... 364/468.15, 468.16, 364/468.17, 468.28; 438/14, 16, 17; 324/765; 382/145

[56] References Cited

U.S. PATENT DOCUMENTS

| | | | |
|---|---|---|---|
| 4,618,938 | 10/1986 | Sandland et al. | 364/552 |
| 4,863,548 | 9/1989 | Lee | 156/345 |
| 5,240,866 | 8/1993 | Friedman et al. | 437/8 |
| 5,274,434 | 12/1993 | Morioka et al. | 437/8 |
| 5,399,531 | 3/1995 | Wu | 437/205 |
| 5,418,172 | 5/1995 | Falster et al. | 437/8 |
| 5,464,779 | 11/1995 | Fujimaki | 437/8 |
| 5,523,252 | 6/1996 | Saito | 437/8 |
| 5,665,605 | 9/1997 | Mori | 438/16 |
| 5,711,848 | 1/1998 | Itussalde | 156/627.1 |
| 5,773,315 | 6/1998 | Jarvis | 438/14 |

FOREIGN PATENT DOCUMENTS

| | | | |
|---|---|---|---|
| 3-214641 | 9/1991 | Japan | 437/8 |
| 5-21365 | 1/1993 | Japan | 437/8 |

OTHER PUBLICATIONS

Isolating the ller Defect: Process analysis using Particle Map to Probe Map Correlation, Carman et al., pp. 198–203, 1993 IEEE/Semi Advanced Semiconductor Manufacturing Conference.

Primary Examiner—Paul P. Gordon
Attorney, Agent, or Firm—Wood,Herron&Evans, L.L.P.

[57] ABSTRACT

A method for identifying those process steps which produce "high risk" particulate contamination that is most likely to produce defects. The die positions of particulate deposits on a wafer are measured prior to and subsequent to a specific process step, to determine the die positions of particulate deposits introduced during that specific process step. Then, subsequent electrical tests of the wafer are used to determine which locations on the wafer contain faulty circuitry. The locations of particulate deposits introduced during the specific process step are then correlated to the locations of faulty circuitry. The result is a measure of the extent to which particulate deposits introduced during the specific process step contribute to reductions in yield of the manufacturing process.

14 Claims, 2 Drawing Sheets

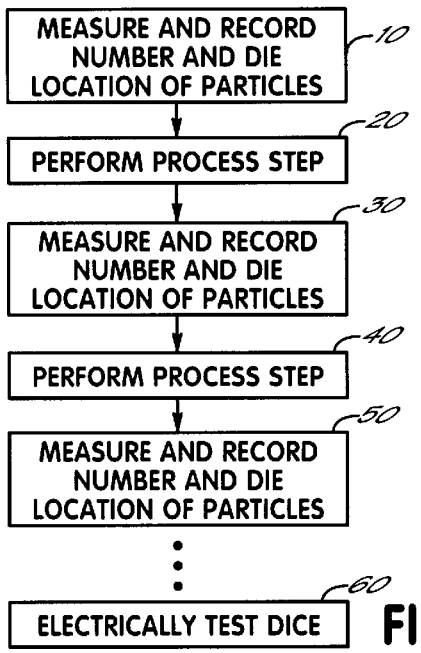
FIG. 1
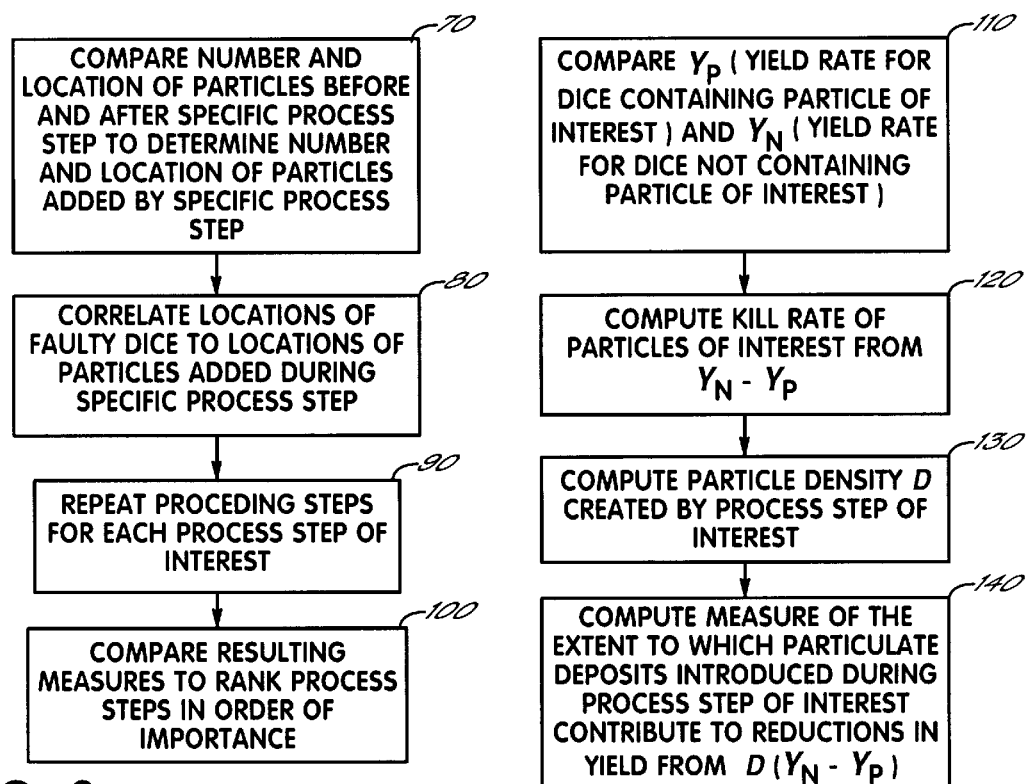
FIG. 2
FIG. 3
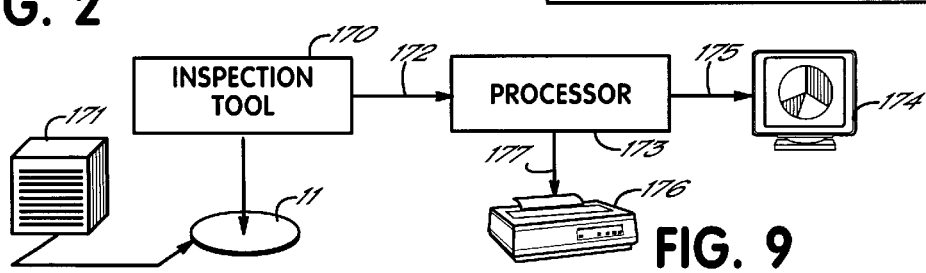
FIG. 9

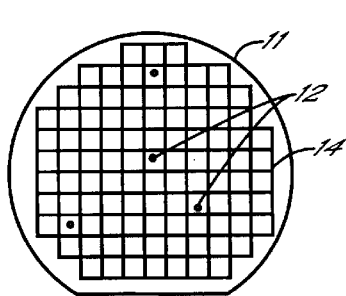
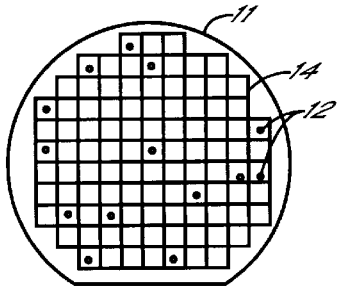
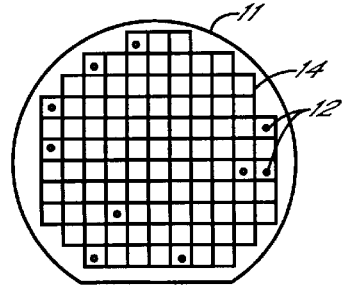
FIG. 1A     FIG. 1B     FIG. 1C
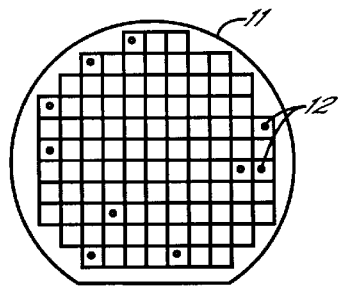
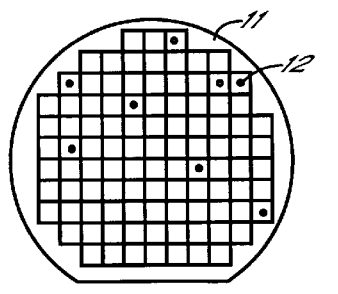
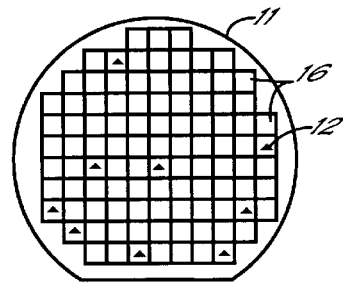
FIG. 4A     FIG. 5A     FIG. 6A
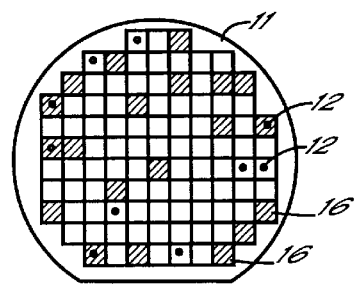
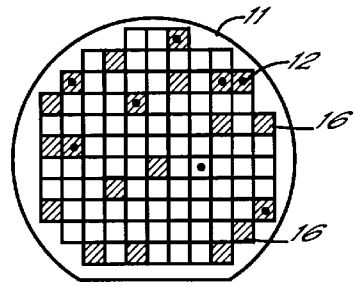
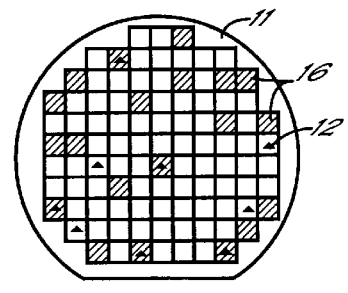
FIG. 4B     FIG. 5B     FIG. 6B
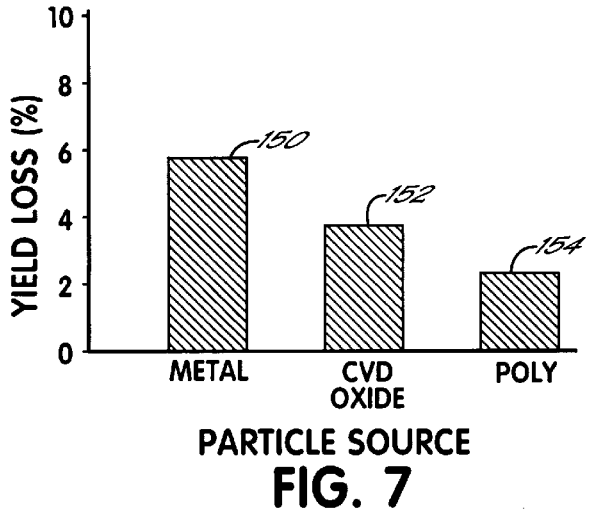
FIG. 7
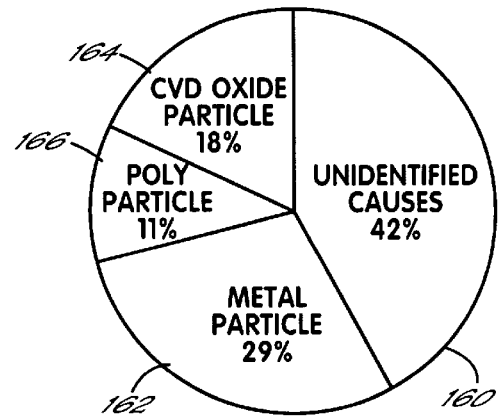
FIG. 8

IDENTIFYING CAUSES OF SEMICONDUCTOR PRODUCTION YIELD LOSS

CROSS-REFERENCE TO RELATED APPLICATION

This application is a continuation-in-part of previously filed, application Ser. No. 08/426,711, filed Apr. 21, 1995 by the same inventor and assigned to the same assignee now U.S. Pat. No. 5,665,609 issued Sep. 9, 1997.

FIELD OF THE INVENTION

The present invention relates to inspection and analysis of defects in semiconductor circuitry to improve manufacturing productivity.

BACKGROUND OF THE INVENTION

A primary limitation on the productivity of a semiconductor manufacturing facility is contamination of wafers and corresponding reductions in yield. Typically a wafer includes a number of circuits which are diced (separated) and packaged for sale; a fatal defect in one die, while not necessarily affecting the other dice, typically renders the defective die commercially worthless.

The most typical cause of defects in dice is particulate contamination of the surface of the wafer during processing. Efforts to improve yield often focus on reducing such particulate contamination.

There are several commercially available products for inspecting semiconductor wafers to identify particulate deposits. Semiconductor fabrication facilities typically use these devices to identify the number of particulate deposits on wafers, and use this information as a measure of the quality of the manufacturing process. Efforts are then made to reduce the particulate contamination in order to improve yield.

SUMMARY OF THE INVENTION

Procedures for improving semiconductor fabrication yield have often been based on the (typically implicit) assumption that every particle has a similar likelihood of damaging circuitry and negatively impacting yield. Accordingly, efforts to improve yield have typically focussed on improving those processing steps or procedures which produce the greatest number of particles.

However, particulate deposits which contaminate wafers originate from a number of different sources and may take many different forms, including conductive (e.g., metal) fragments, semiconductor (e.g., polysilicon) fragments, and various forms of conductive and nonconductive dust. It has been found that these different kinds of particulate deposits have substantially different likelihood of damaging the circuitry on which they land. Specifically, one kind of particulate contamination may be "high risk", nearly always producing defects in the die on which it lands, whereas another kind of particulate contamination may be relatively "low risk", relatively less often producing defects in the die on which it lands.

In accordance with the present invention, efforts to increase yield by reducing particulate contamination can be made substantially more effective by identifying those process steps which produce "high risk" particulate contamination that is most likely to produce defects, and applying higher priority to efforts to reduce these high risk sources of particulate contamination as compared to low risk sources of particulate contamination. The process steps which produce the most particles may not have the most significant impact on yield; rather, in accordance with the present invention particle reduction efforts might be focussed on process steps which produce a relatively small number of particles, if the particles produced thereby are particularly likely to damage the circuitry on the wafer.

Thus, unlike the typical procedure described above, in accordance with the present invention, efforts to improve yield will not necessarily focus on improving those processing steps or procedures which produce the greatest number of particles, but rather will focus on improving those process steps in which the greatest impact on yield will result.

To accomplish the foregoing, the present invention features a method for measuring the impact of a given process step on the yield of a semiconductor manufacturing process, so that the process steps can be ranked in order of importance. First, the number and locations (e.g., die positions) of particulate deposits on a wafer are measured prior to and subsequent to a specific process step. From these measurements, the number and locations of particulate deposits introduced during that specific process step are determined. Then, subsequent electrical tests of the wafer (or of individual dice after dicing of the wafer) are used to determine which locations on the wafer contain faulty circuitry. The locations of particulate deposits introduced during the specific process step are then correlated to the locations of faulty circuitry. The result is a measure of the extent to which particulate deposits introduced during the specific process step contribute to reductions in yield of the manufacturing process.

In specific embodiments, the correlation described above is obtained by computing a first yield rate $Y_P$ for those dice in which a particle was received during the specific process step, and a second yield rate $Y_N$ for those dice in which a particle was not received during the specific process step, and then comparing these yield rates, e.g. by forming the ratio $Y_P/Y_N$. (The yield rate $Y_P$ is computed from a ratio of the number of tested dice that received a particle during the specific process step but were not faulty, to the total number of dice that received a particle during the specific process step. The yield rate $Y_N$ is computed from a ratio of the number of tested dice that did not receive a particle during the specific process step and were not faulty, to the total number of tested dice that did not receive a particle during the specific process step.) The ratio $Y_P/Y_N$ can then be converted to a "kill rate", indicative of the likelihood that a particle received on a die during the specific process step will create a fault in the die. In one embodiment, the kill rate is identified by forming the quantity $Y_N - Y_P$. In another embodiment, the kill rate is identified by forming the quantity $(1 - Y_P/Y_N)$. This kill rate, when multiplied by the particle density D (percentage of dice which received a particle during the specific process step), produces a measure of the amount of yield loss Y.L. attributable to the specific process step. (The particle density D can be obtained by computing a ratio of the number of dice tested that received a particle during the specific process step, to the total number of dice.)

The above-described measurement process, when applied repeatedly to several different process steps, produces several comparative measures, one for each process step, of the extent to which particulate produced during each process step contributes to reductions in yield. Using these measures, the process steps can be ranked in order of importance, so that efforts to reduce particulate contamination can be focussed on those process steps which contribute most significantly to reductions in yield, improving the impact of particle reduction efforts on the yield of the fabrication process.

This measurement process may be applied to a single wafer as it travels through the fabrication process; however, the method may also be applied to multiple wafers which are sequentially fabricated, or to a wafer lot which travels collectively through the fabrication process. By applying the measurements to multiple wafers, statistical variation and uncertainty may be reduced as compared to performing the measurements on a single wafer.

Aspects of the invention also include apparatus for carrying out the steps described above.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

FIG. 1 is a flow chart illustrating a semiconductor fabrication process including measurement steps used in accordance with principles of the present invention;

FIG. 1a is a diagram of die and particle locations on a wafer prior to a polysilicon deposition process step, FIG. 1b is a diagram of die and particle locations on a wafer subsequent to polysilicon deposition, and FIG. 1c is a diagram of the locations of particles added during the polysilicon deposition process step;

FIG. 2 is a flow chart of steps for generating a measure for ranking a process step in order of importance in accordance with principles of the present invention;

FIG. 3 is a flow chart of steps for correlating the locations of faulty dice to the locations of particles added during a specific process step;

FIGS. 4a, 5a and 6a are diagrams illustrating the particles added during polysilicon, metal, and APCVD processing steps, respectively, and FIGS. 4b, 5b and 6b are diagrams illustrating the correlation of particles added during polysilicon, metal and APCVD processing steps to the locations of faulty dice; and FIGS. 7 and 8 are bar and pie charts, respectively, illustrating the relative contributions to yield loss of particles from the metal, Poly and APCVD processing steps.

FIG. 9 is a schematic block diagram of an apparatus for carrying out the steps described in the preceding Figures.

DETAILED DESCRIPTION OF SPECIFIC EMBODIMENTS

Referring to FIG. 1, in accordance with the principles of the present invention, measurements are made throughout a fabrication process to collect data used to determine which process step most negatively impacts yield. Specifically, prior to each process step to be evaluated, an inspection tool, such as the 7600 Wafer Inspection Machine, available from Tencor of Mountain View, Calif., is used to measure and record the number and die location of particles on the wafer (step 10).

Referring to FIG. 1A, the particles detected in step 10 can be diagrammatically illustrated as dots 12 representing particles in a grid 14 representing the die locations on the wafer 11. In the example of the principles of the present invention described herein, the particle accumulation on a wafer 11 having 100 dice is measured and used to rank the various process steps. However, it should be noted that the particle accumulation on multiple wafers, having many hundreds or thousands of dice can also be measured and used to rank the various process steps. The use of multiple wafers reduces the statistical uncertainty and variation of the measurements performed. Where measurements are made on multiple wafers, the wafers may be processed together as a lot, or may be processed separately in smaller groups of one or more.

After measuring and recording the die location of particles, a process step is performed (step 20). In the example illustrated in the Figures, this process step is a polysilicon deposition. Subsequent to the process step, the inspection tool is used to again measure and record the number and die locations of particles on the wafer (step 30). As shown in FIG. 1B, again this data can be diagrammatically represented as dots 12 representing particles positioned in a grid 14 representing the die positions of dice on the wafer 11.

After the second measurement 30, another process step is performed (step 40), for example a metal process step, and following the process step, the inspection tool is used to again measure and record the number and die locations of particles (step 50). This procedure of recording die locations of particles prior to and subsequent to each process step is performed for each process step which is to be evaluated. (In the illustrated example, the location of particles is recorded subsequent to an APCVD process step.) Ultimately, after completion of all of the process steps (or potentially between process steps), the wafer is electrically tested (step 60) to determine which dice on the wafer are electrically faulty.

Referring to FIG. 2, after collecting data regarding the number and location of particles prior to and subsequent to each process step, and the locations of faulty dice, this data is assimilated and used to rank the process steps.

To generate this ranking, the number and location of particles before and after each process step of interest is compared (step 70), to determine the number and location of particles that were added by each specific process step. As seen in FIG. 1C, this operation is diagrammatically illustrated by removing from FIG. 1B those particles that appear in FIG. 1A, resulting in the diagram of FIG. 1C (repeated as FIG. 4A), which shows only those particles 12 which were added to the wafer 11 during the polysilicon process step.

After determining location of particles added during each process step of interest, these locations are correlated to the locations of faulty dice (step 80).

Steps 70 and 80 are repeated 90 for each process step of interest. Specifically, for each process step the measurements taken prior to and after the process step are used to determine the number and location of particles added by the process step. (The results of these operations can be represented by additional diagrams showing the locations of particles added by the additional process steps, such as FIGS. 5A and 6A, which represent the particles introduced by the metal and APCVD process steps.) Thereafter, the locations of particles added during a specific process step are correlated to the locations of faulty dice.

After these calculations have been performed for each process step of interest, the result is a set of measures of the extent to which each of the process step contributes to a reduction of yield of the fabrication process. These measures can then be compared (step 100) to rank the process steps in the order of importance. Thereafter, efforts to improve the yield of the fabrication process by reducing particles can be focused on those steps which have the greatest contribution to reductions in yield.

Referring to FIG. 3, the correlation of step 80 of FIG. 2 is determined through a sequence of computations, discussed below. In a first step 110, a yield rate is computed for those dice which accumulated a particle during the specific process step of interest. This yield rate is referred to as $Y_P$. At the same time, a yield rate is computed for those dice which did not accumulate a particle during a specific process step of interest. This latter yield rate is referred to as $Y_N$.

In one specific embodiment, the yield rate $Y_P$ is computed by first determining the number $N_{PG}$ of dice which accumulated a particle during the process step of interest but were not faulty when electrically tested. Next, a number $N_P$ of dice which accumulated a particle during the process step of interest is determined. Finally the yield of dice which accumulated a particle during the process step of interest is computed from the ratio $Y_P = N_{PG}/N_P$. In this specific embodiment, the yield $Y_N$ is computed from $N_{PG}$ and $N_P$, by further determining the number of dice N which were tested in step 60, and the number of dice $N_G$ which were not found faulty during step 60. From these numbers, the yield of dice which did not accumulate a particle during the process step of interest can be computed from the formula $Y_N = (N_G - N_{PG})/(N - N_P)$. (The quantity $N - N_P$ represents the number of dice which did not accumulate a particle during the process step, and may be more simply represented by the symbol $N_N$, as will be used in the following.)

Once the yield rates $Y_P$ and $Y_N$ have been computed as noted above, they are used to compute the kill rate for the particles generated by the process step of interest (step 120). This kill rate represents the percent likelihood that a particle accumulated during the process step of interest will result in a faulty die. The kill rate is determined from the formula $Y_N - Y_P$.

The formula $Y_N - Y_P$ may be verified by first considering that the number of good dice, in the absence of any particles, would be equal to $NY_N$, i.e., equal to the yield rate $Y_N$ for dice without particles multiplied by the number of dice N. Furthermore, if there were $N_P$ particles, the number of good dice would be equal to $(N_N Y_N + N_P Y_P)$, i.e., equal to the number $N_N$ of dice without particles multiplied by the yield $Y_N$ of dice without particles, added to the number $N_P$ of dice with particles multiplied by the yield $Y_P$ of dice with particles. Thus, the number of dice lost due to the addition of $N_P$ particles is the difference of these formulas, i.e., equal to $NY_N - (N_N Y_N + N_P Y_P)$. This difference may be simplified (making use of the fact that $N = N_N + N_P$), to the formula $N_P(Y_N - Y_P)$. Finally, this difference, representing the number of dice lost due to the addition of $N_P$ particles, may be divided by the number of particles $N_P$ that produced the loss, to obtain the yield loss per particle. The result is the formula $Y_N - Y_P$ identified above.

Other formulas might be used to compute the kill rate. For example, in an alternative embodiment, the kill rate is computed from the formula $1 - (Y_P/Y_N)$.

Next, a particle density D is computed (step 130). The particle density D represents the percent of dice on the wafer which accumulated a particle during the process step of interest. Particle density D can be computed from the formula $D = N_P/N$.

Finally, a measure of the extent to which particulate deposits introduced during the process step of interest have contributed to reduction in yield is computed (step 140). This measure, which will be referred to as Y.L. can be used for comparative purposes to determine which process step is most responsible for reductions in yield. Y.L. may be computed by multiplying the particle density produced by the process step of interest by the kill rate of particles for the process step of interest, i.e., from the formula $Y.L. = D(Y_N - Y_P)$.

Table I, set forth below, illustrates the computations described above applied to exemplary data collected during three process steps including a polysilicon process step, a metal process step and an APCVD process step. FIG. 4A (which is a repetition of FIG. 1C) illustrates the particles 12 added during the polysilicon process step. There are 10 particles that have been introduced to the wafer; thus for the polysilicon process step $N_P = 10$. FIG. 4B illustrates, in addition, the dice which contained faulty circuitry (represented as shaded areas). As can be seen from FIG. 4B, there are six dice which accumulated a particle during the polysilicon process step but nonetheless were not faulty when tested. Thus, for the polysilicon step $N_{PG} = 6$. These values are tabulated in Table I.

Referring to FIG. 5A, it can be determined that 8 particles were added by the metal process step, therefore, $N_P = 8$. Referring to FIG. 5B, it can be determined that only one die which accumulated a particle nevertheless was not faulty. Therefore, $N_{PG} = 1$.

Referring to FIG. 6A, it can be seen that for the APCVD process step, 9 particles were accumulated, so $N_P = 9$. Referring to FIG. 6B, it can be seen that 4 dice which accumulated particles nevertheless were not faulty, so $N_{PG} = 4$.

For each process step, a wafer 11 with 100 dice was used and all 100 dice were tested, therefore for each process step $N = 100$. Furthermore, the total number of non-faulty dice was 80, so $N_G = 80$. These values are identified in Table I along with the values for $N_P$ and $N_{PG}$ noted above for each process step. The table also identifies the values for $Y_P$, $Y_N$, D and Y.L. for each process step.

TABLE I

| Process Step | N | $N_G$ | $N_P$ | $N_P/N$ (D) | $N_{PG}$ | $Y_P$ | $Y_N$ | Y.L. |
|---|---|---|---|---|---|---|---|---|
| Poly | 100 | 80 | 10 | 0.10 | 6 | 0.60 | 0.82 | 2.2% |
| Metal | 100 | 80 | 8 | 0.08 | 1 | 0.13 | 0.86 | 5.8% |
| APCVD | 100 | 80 | 9 | 0.09 | 4 | 0.44 | 0.84 | 3.6% |

Where:

N—Number of dice inspected after process step of interest.

$N_G$—Number of non-faulty dice.

$N_P$—Number of dice with particle introduced by process step of interest.

$N_P/N$ (=Defect Density D)—Fraction of dice having particle introduced by process step of interest.

$N_{PG}$—Number of non-faulty dice having particle introduced by process step of interest.

$Y_P$ (=$N_{PG}/N_P$)—Yield of dice having a particle introduced by process step of interest.

$Y_N$ (=$(N_G - N_{PG})/(N - N_P)$)—Yield of dice not having a particle introduced by process step of interest.

Y.L. (=$D(Y_P - Y_N)$)—Yield loss attributable to particles introduced during process step of interest.

Now considering the rightmost column in Table I, which indicates the values of Y.L. for each process step, it is notable that, although the polysilicon (poly) process step produced the greatest number of particles $N_P$, and the metal process step produced the smallest number of particles $N_P$, the kill rate for the particles produced in the metal process step was substantially greater than the kill rate for the particles produced in the polysilicon process step. As a result, the yield loss Y.L. attributable to the metal process step is substantially larger than the yield loss attributable to the polysilicon process step. In fact, a loss of 5.8% of the dice on the wafer is attributable to the metal process step, whereas less than half this yield loss, only 2.2% of the dice, is attributable to the polysilicon process step. Thus, efforts to improve the yield of the fabrication process as a whole, would appear to be substantially more effective if focused on reducing particles during the metal process step, rather than reducing particles produced during the polysilicon process step, despite the greater number of particles produced by the polysilicon process step.

Referring to FIG. 7, the data tabulated in Table I can also be represented graphically as a bar chart. As seen in FIG. 7, bars 150, 152, 154 represent the yield loss percentages attributable to particles produced by the metal, APCVD, and polysilicon process steps, respectively. This bar chart clearly illustrates the relative magnitude of yield loss, and the substantially greater effect of the particles produced in the metal process step than particles produced in other process steps.

Referring to FIG. 8, this data may also be graphically illustrated in a pie chart. Pie slices 162, 164, 166, represent the yield losses attributable to the metal, APCVD and polysilicon process steps. Since there is a total of 20% yield loss from the wafer (i.e., 20 of 100 dice on the wafer were faulty), the chart includes an additional pie slice 160 which represents the 8.4% yield loss from unidentified causes. A pie chart such as shown in FIG. 8 can be useful in assisting quality control engineers in determining whether particle contamination is a substantial or an insignificant source of yield production as compared to the unknown causes which are represented by slice 160.

Using the data produced in accordance with principles of the present invention, whether presented in tabular form such as in Table I, or graphically such as in FIGS. 7 or 8, quality control engineers can rapidly determine which of several process steps most substantially contribute to reductions in yield due to particulate contamination, and focus particulate reduction efforts on the most important process steps. Furthermore, it can be determined whether particulate contamination produced during one or a few specific process steps are, overall, a substantial or insubstantial contributor to the overall reductions in yield, thus potentially directing efforts toward or away from specific process steps.

Referring to FIG. 9, an apparatus for performing these steps includes an inspection tool 170 for measuring the number of particles present on the surface of a wafer 11 and for electrically testing a wafer 11. Inspection tool 170 may inspect individual wafers or, as noted above, may inspect wafers in lots of, e.g., 25 wafers, for example held in a cassette 171.

Data produced by the inspection tool, regarding the number and location of particles on the one or more wafers that are inspected, and the locations of faulty dice on wafers, is transferred, over line 172, to a processor 173, which performs the steps described above to generate rankings and other data such as is shown in Table I. Processor 173 then delivers this information to a monitor 174 over line 175 to display the data to the operator. The data may be displayed as a table such as Table I, or graphically such as shown in FIGS. 7 and 8. The monitor 174 illustrated in FIG. 9 is depicting a pie chart such as that shown in FIG. 8. Processor 173 may also deliver the data to a printer 176 over line 177, such that printer 176 produces a printed output identifying the data in tabular or graphic form.

Processor 173 may be incorporated into inspection tool 170 to form a single inspection device, or may be a separate device connected to inspection tool 170 via electronic cabling 172. Alternatively, processor 173 may include a keypad through which an operator can manually enter the number and locations of particles detected on the surface of each wafer 11 using the inspection tool 170.

Processor 173 may be implemented in a number of ways, such as by general purpose computing circuitry (e.g., an IBM compatible computer) running custom software, by a hand-held or palmtop computing device, or by custom computing circuitry.

The above methods have been applied to a process for fabricating high speed SRAM 0.4 µm line width chips (dice), using a sequence of 30 process steps, specifically, 9 etching steps, 7 TEOS steps, 4 APCVD steps, 3 nitride steps, 3 polysilicon steps, 2 silicide steps and 2 metal steps. The prioritization analysis methodology described above with respect to FIGS. 1–7 were performed over time (each analysis being performed on two batches of wafers) to determine the most important sources of particles.

Particles were measured before and after each of the 30 process steps of interest (steps 30 and 50, FIG. 1) using a Tencor 7600 inspection tool, and a computer (based an Intel "Pentium" processor and running software supplied for use with the inspection tool by Tencor was used to analyze the output of the inspection tool to determine the particles added by each process step (step 70, FIG. 2). Subsequently, the locations of faulty dice were correlated with the locations of particles added by each of the process steps (step 80, FIG. 2), producing yield loss (Y.L.) figures for each of the 30 specific process steps. Then, the yield loss figures for process steps performed in the same equipment were combined, i.e., the yield loss figures for the 9 etch steps were combined, the yield loss figures for the 7 TEOS steps were combined, and so on, to obtain figures representative of the total yield loss produced by each item of equipment.

The resulting total yield losses indicated that the 9 etching steps were responsible for the largest yield loss (roughly 3.2%), followed by the 7 TEOS steps (2.8%), the 2 metal steps (2.0%), the 3 polysilicon steps (1.5%), the 2 silicide steps (1.3%), the four APCVD steps (0.8%), and the 3 nitride steps (0.6%). Detectible scratches accounted for roughly another 0.7% of yield loss. (At the time of this test, the overall yield of the process was about 75%, so the yield losses attributable to particles, taken together, represented just over 50% of the total yield loss of the process.)

This data indicated, as might be expected, that a process tool that is used frequently in a given process, for example the reactive ion etcher used for the 9 etching steps described above, is more likely be an important source of die-killing particles, as compared to a process tool that is used infrequently. However, some process tools, such as the metal sputtering machine used in the 2 metal steps, have an important impact on yield even when used in only a few process steps.

After accumulating the above data, particle reduction efforts were undertaken over a three month period to improve the yield of the 30 step SRAM process described above, by focussing efforts on the important sources of die-killing particles. For example, the frequency of cleanings of the reactive ion etcher was doubled, and the metal sputtering machine was replaced with a new machine having lower particle generation. These efforts improved the overall yield of this process from 75% up to about 83%, during a three month period, or an 8% net yield improvement, representing an annual savings of several million dollars.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method of identifying causes which reduce yield of a manufacturing process, said process producing wafers containing semiconductor circuitry and involving multiple processing steps including a first specific process step which potentially introduces particulate deposits on wafers, comprising the steps of:

detecting a number and location of particulate deposits on a wafer prior to and subsequent to said first specific process step, and determining therefrom a number and locations of particulate deposits introduced during said first specific process step;

electrically testing semiconductor circuitry in a plurality of locations of said wafer subsequent to said first specific process step, and identifying locations of said wafer which contain faulty circuitry;

correlating the locations of particulate deposits introduced during said first specific process step to the locations of said wafer containing faulty circuitry subsequent to said first specific process step; and determining, from said correlating, a first measure of reductions in yield of said manufacturing process caused by particulate deposits introduced during said first specific process step relative to other causes of reductions in yield.

2. The method of claim 1 wherein said process includes a second specific process step which potentially introduces particulate deposits on wafers, and said electrically testing step is performed subsequent to said second specific process step;

further comprising the steps of:

detecting a number and location of particulate deposits on said wafer prior to and subsequent to said second specific process step, and determining therefrom a number and locations of particulate deposits introduced during said second specific process step;

correlating the locations of particulate deposits introduced during said second specific process step to the locations of said wafer containing faulty circuitry;

determining, from said correlating, a second measure of reductions in yield caused by particulate deposits introduced during said second specific process step relative to other causes of reductions in yield; and comparing said first and second measures to determine the relative contributions to reductions in yield from particulate deposits introduced during said first and second specific process steps.

3. The method of claim 2 wherein said process includes a third specific process step which potentially introduces particulate deposits on wafers, said electrically testing step is performed subsequent to said third specific process step, said first and third specific process steps are performed using a first processing tool, and said second specific process step is performed using a second processing tool;

further comprising the steps of:

detecting a number and location of particulate deposits on said wafer prior to and subsequent to said third specific process step, and determining therefrom a number and locations of particulate deposits introduced during said third specific process step;

correlating the locations of particulate deposits introduced during said third specific process step to the locations of said wafer containing faulty circuitry;

determining, from said correlating, a third measure of reductions in yield caused by particulate deposits introduced during said third specific process step relative to other causes of reductions in yield;

determining from at least a sum of said first and third measures a first combined measure indicative of contributions to reductions in yield from particulate deposits introduced by said first processing tool;

determining from at least said second measure a second combined measure indicative of contributions to reductions in yield from particulate deposits introduced by said second processing tool; and comparing said first and second combined measures to determine relative reductions in yield from particulate deposits introduced by said first and second processing tools.

4. The method of claim 1 applied to additional wafers in a lot, further comprising detecting a number and location of particulate deposits on each said additional wafer in said lot prior to and subsequent to said first specific process step, and determining therefrom a number and locations of particulate deposits introduced to said additional wafers during said first specific process step; and further comprising electrically testing semiconductor circuitry in a plurality of locations on each said additional wafer subsequent to said first specific process step, and identifying locations of each said additional wafer which contain faulty circuitry;

wherein said correlating step includes correlating the locations of particulate deposits introduced on said additional wafers during said first specific process step to the respective locations of said additional wafers containing faulty circuitry;

thereby reducing statistical variation in said first measure of reductions in yield caused by particulate deposits introduced during said first specific process step relative to other causes of reductions in yield.

5. The method of claim 1 wherein said electrical testing step is performed prior to completion.

6. The method of claim 1 wherein correlating the locations of particulate deposits to the locations of said wafer containing faulty circuitry comprises the steps of:

computing a first yield rate for locations containing a detected particle, by computing a ratio of a number of tested locations that contained a particle and were not faulty, to a number of tested locations that contained a particle, and computing a second yield rate for locations not containing a detected particle, by computing a ratio of a number of tested locations that did not contain a particle and were not faulty, to a number of tested locations that did not contain a particle; and determining a measure of reductions in yield caused by particulate deposits relative to other causes of reductions in yield comprises the steps of:

computing a kill rate from a difference between said first yield rate and said second yield rate, computing a particle density by computing a ratio of a number of tested locations that contained a particle to a number of tested locations, and multiplying said kill rate by said particle density to determine said measure of reductions in yield caused by particulate deposits relative to other causes of reductions in yield.

7. The method of claim 6 wherein computing said kill rate comprises subtracting said first yield rate from said second yield rate.

8. The method of claim 1 adapted for use with a process which produces wafers including a plurality of dice which are to be mechanically separated at an end, wherein electrically testing said circuitry at a plurality of locations comprises testing dice in said wafer for correct operation.

9. Apparatus for of identifying causes which reduce yield of a manufacturing process, said process producing wafers containing semiconductor circuitry and involving multiple processing steps including a first specific process step which potentially introduces particulate deposits on wafers, comprising:

circuitry determining, from a number and location of particulate deposits on a wafer prior to and subsequent to said first specific process step, a number and locations of particulate deposits introduced during said first specific process step;

circuitry correlating the locations of particulate deposits introduced during said first specific process step to the locations of said wafer determined to contain faulty circuitry subsequent to said first specific process step; and circuitry determining, from said correlating, a first measure of reductions in yield caused by particulate deposits introduced during said first specific process step relative to other causes of reductions in yield.

10. The apparatus of claim 9 adapted for use with a process which includes a second specific process step which potentially introduces particulate deposits on wafers, further comprising:

circuitry determining, from a number and location of particulate deposits on said wafer prior to and subsequent to said second specific process step, a number and locations of particulate deposits introduced during said second specific process step;

circuitry correlating the locations of particulate deposits introduced during said second specific process step to the locations of said wafer determined to contain faulty circuitry subsequent to said second specific process step; and circuitry determining, from said correlating, a second measure of reductions in yield caused by particulate deposits introduced during said second specific process step relative to other causes of reductions in yield of said manufacturing process;

whereby a comparison of said first and second measures can determine the relative contributions to reductions in yield from particulate deposits introduced during said first and second specific process steps.

11. The apparatus of claim 10 adapted for use with a process which includes a third specific process step which potentially introduces particulate deposits on wafers, wherein said first and third specific process steps are performed using a first processing tool and said second specific process step is performed using a second processing tool, further comprising:

circuitry determining, from a number and location of particulate deposits on said wafer prior to and subsequent to said third specific process step, a number and locations of particulate deposits introduced during said third specific process step;

circuitry correlating the locations of particulate deposits introduced during said third specific process step to the locations of said wafer determined to contain faulty circuitry subsequent to said third specific process step; and circuitry determining, from said correlating, a third measure of reductions in yield caused by particulate deposits introduced during said third specific process step relative to other causes of reductions in yield;

circuitry determining from at least a sum of said first and third measures a first combined measure indicative of contributions to reductions in yield from particulate deposits introduced by said first processing tool; and circuitry determining from at least said second measure a second combined measure indicative of contributions to reductions in yield from particulate deposits introduced by said second processing tool;

whereby a comparison of said first and second combined measures can determine the relative reductions in yield from particulate deposits introduced by said first and second processing tools.

12. The apparatus of claim 9 wherein said circuitry correlating the locations of particulate deposits to the locations of said wafer containing faulty circuitry comprises:

circuitry computing a first yield rate for locations containing a detected particle, by computing a ratio of a number of tested locations that contained a particle and were not faulty, to a number of tested locations that contained a particle, and circuitry computing a second yield rate for locations not containing a detected particle, by computing a ratio of a number of tested locations that did not contain a particle and were not faulty, to a number of tested locations that did not contain a particle.

13. The apparatus of claim 12 wherein said circuitry determining a measure of reductions in yield caused by particulate deposits relative to other causes of reductions in yield comprises:

circuitry computing a kill rate from a difference between said first yield rate and said second yield rate, circuitry computing a particle density by computing a ratio of a number of tested locations that contained a particle to a number of tested locations, and circuitry multiplying said kill rate by said particle density to determine said measure of reductions in yield caused by particulate deposits relative to other causes of reductions in yield.

14. The apparatus of claim 13 wherein said circuitry computing said kill rate subtracts said first yield rate from said second yield rate.

* * * * *